(12) United States Patent
Ryu et al.

(10) Patent No.: US 7,135,388 B2
(45) Date of Patent: Nov. 14, 2006

(54) METHOD FOR FABRICATING SINGLE CRYSTAL SILICON FILM

(75) Inventors: Myung Kwan Ryu, Seoul (KR); Ho Nyeon Lee, Kyoungki-do (KR); Jae Chul Park, Seoul (KR); Eok Su Kim, Seoul (KR)

(73) Assignee: Boe Hydis Technology Co., Ltd., Kyoungki-do (KR)

( * ) Notice: Subject to any disclaimer, the term of this patent is extended or adjusted under 35 U.S.C. 154(b) by 31 days.

(21) Appl. No.: 10/714,226

(22) Filed: Nov. 14, 2003

(65) Prior Publication Data

US 2004/0192013 A1    Sep. 30, 2004

(30) Foreign Application Priority Data

Mar. 31, 2003 (KR) .............. 10-2003-0019953

(51) Int. Cl.
*H01L 21/20* (2006.01)
(52) U.S. Cl. .............. 438/478; 438/486; 438/487
(58) Field of Classification Search .......... 438/478, 438/479, 481, 482–483, 486–488
See application file for complete search history.

(56) References Cited

U.S. PATENT DOCUMENTS

| | | | | |
|---|---|---|---|---|
| 5,304,357 A | * | 4/1994 | Sato et al. | 118/50.1 |
| 6,113,689 A | * | 9/2000 | Moon | 117/43 |
| 6,326,286 B1 | * | 12/2001 | Park et al. | 438/478 |

* cited by examiner

*Primary Examiner*—Thanh Nguyen
(74) *Attorney, Agent, or Firm*—Ladas & Parry LLP

(57) ABSTRACT

The present invention relates to a method for fabricating a single crystal silicon thin film at the desired location to the desired size from an amorphous or polycrystalline thin film on a substrate using laser irradiation and laser beam movement along the substrate having the semiconductor thin films being irradiated. This method comprises the steps of: forming a semiconductor layer or a metal thin film on a transparent or semi-transparent substrate; forming a single crystal seed region on the substrate of the desired size by a crystallization method using laser irradiation; and converting the desired region of the semiconductor layer or metal thin film into a single crystal region, using the single crystal seed region.

10 Claims, 19 Drawing Sheets

460

METHOD FOR FABRICATING SINGLE CRYSTAL SILICON FILM

BACKGROUND OF THE INVENTION

1. Field of the Invention

The present invention relates to a method for fabricating a semiconductor thin film, and more particularly to a method for fabricating a single crystal silicon thin film at the desired location to the desired size from an amorphous or polycrystalline thin film on a substrate using laser irradiation and laser beam movement along the substrate having the semiconductor thin films being irradiated.

2. Description of the Prior Art

Generally, a thin film transistor (hereinafter, referred to as TFT), a core switching device, which is used in LCD or OLED using organic EL material, is the most important semiconductor device for the performance of a flat panel display (hereinafter, referred to as FPD).

Mobility or leakage current, a measure of the TFT performance, greatly varies depending on the state or structure of a silicon (Si) thin film, which forms an active layer, a channel for charge carrier transport. In the case of a currently commercially available LCD, the active layer of most TFTs is made of an amorphous silicon (a-Si) thin film.

Since a-Si TFT using a-Si has a very low mobility of about 0.5 $cm^2/Vs$, there is a limitation in making all switching devices required in LCD, using a-Si TFT. This is because a switching device for a peripheral circuit of LCD needs to be operated at a very high speed, but this high speed cannot be achieved with a-Si TFT.

Thus, switching parts for the peripheral circuit, such as a driver circuit, various controllers, and a digital-analogue-converter (DAC), etc., are formed of switching devices integrated on single crystal Si to cope with a high-speed requirement for the LCD driving. On the other hand, since a-Si TFT has a switching function while showing a characteristic of low-leakage current required for ensuring image quality, it is used as a pixel-switching device.

TFT using poly-crystal Si has a high mobility of several tens to several hundreds $cm^2/Vs$ and thus can exhibit high driving speed suitable for the periphery circuit. Thus, formation of poly-Si on a glass substrate allows a pixel region and also a peripheral circuit region to be realized.

Accordingly, in the case of poly-Si TFT, separate part mounting processes required for the formation of the peripheral circuit are not required and the peripheral circuit can be formed simultaneously with a pixel region, so that a reduction in part costs for the peripheral circuit can be expected.

In addition, because of high mobility, poly-Si allows TFT to be produced at a smaller size than existing a-Si and enables the peripheral circuit and the pixel region to be formed by an integration process. Thus, making linewidth fine becomes easier so that poly-Si TFT can realize high resolution as compared to a-Si TFT-LCD.

Furthermore, poly-Si TFT can show a high-current characteristic and thus is suitable for use in OLED, a current drive type display of the next generation FDP. Thus, studies to form poly-Si and fabricate TFT on a glass substrate are actively conducted at the most recent.

In order to form poly-Si on a glass substrate, a method is typically used, in which a-Si is deposited and then crystallized into poly-Si by thermal treatment. Since the glass substrate is deformed at a higher temperature than 600° C., excimer laser annealing (hereinafter, referred to as ELA) which crystallize only a-Si without causing damage to the substrate is typically used for crystallization. Generally, upon crystallization using ELA, a-Si is irradiated with a laser so that it is melted and re-solidified to produce poly-Si. Upon crystallization, grains are randomly formed such that they have various sizes ranging from several tens nm to a few μm depending on laser irradiation conditions.

Generally, as the size of grains is increased, the mobility of a TFT device is increased and the range of parts, which can be integrated upon the integration of the peripheral circuit, becomes wider. Thus, it is preferred to obtain ELA conditions where the greatest possible size of grains can be obtained, but the greater the size of grains, the worse the uniformity of grain distribution. This causes a degradation in uniformity of device characteristics, and as a result, causes a problem in view of reliability.

Accordingly, in applying ELA-crystallized poly-Si in LCD, there is applied poly-Si having grains of a suitable size in a range where uniformity is ensured. In this case, however, poly-Si TFT having high mobility can not be fabricated due to a limitation on grain size, and thus, there is necessarily a limitation in integrating the peripheral circuit.

U.S. Pat. Nos. 6,368,945 and 6,322,625 disclose a crystallization method where large sizes of grains are obtained while ensuring uniformity. The principle of this method which is called "sequential lateral solidification" (SLS) will now be described.

FIG. 1 is a schematic view of a laser system for carrying out a SLS process. As shown in FIG. 1, a substrate 110 deposited with an a-Si film 120 is placed on a stage 100 and first irradiated with a laser beam 130 through a mask 140. In this case, there can be various patterns in the mask 140.

A typical example of this mask is a slit-shaped mask 200 as shown in FIG. 2a. In the mask 200, slits 210 having a width 220 and a length 230 are patterned. As laser beam is irradiated through the mask, the laser beam passed through the mask is irradiated in a beamlet form, and the irradiated laser beam has such energy that a-Si can be completely melted.

FIG. 3a is an enlarged view of one slit. In FIG. 3a showing a condition before laser irradiation, the reference numeral 310 represents the width of a region exposed through a slit 330, and a-Si 320 is present before exposure to laser irradiation. FIG. 3b shows a condition immediately after laser was irradiated through a slit (condition where laser was irradiated for several tens nanoseconds and then cut-off). In this case, an exposed region was melted into a liquid silicon 360, the boundary between the liquid silicon 360 and the a-Si silicon 340 is formed at the edge of the slit, and a fine poly-Si 350 is formed at the boundary. With the passage of time, the growth of grains is progressed toward the slit center, using the poly-Si 350 as a seed. In a growth process of grains, the growth of grains having slow growth rate is inhibited by grains having fast growth rate so that only some grains are continued to grow. The interface 380 between poly-Si and liquid Si-is continued to move, and ultimately, the poly-Si and the liquid Si meet with each other at the slit center as shown in FIG. 3d. In this case, the grown grain size 320 is approximately a half of the slit width. If the slit width is larger or the supercooling rate of the melted silicon after laser irradiation is fast, nucleation can occur within the liquid silicon 361 before the grains grown from both edges of the slit meet with each other at the boundary 381.

Since this circumstance is undesired, it is important that the laser irradiation conditions, the substrate temperature and the form of a slit are optimized so that the nucleation does not occur.

After the first laser irradiation was completed, a location for laser beam irradiation is shifted by a length of 450 as shown in FIG. 4a, and then, second laser irradiation is conducted through a slit. After the second laser irradiation, silicon between slit boundaries 420, 421 is converted into a liquid silicon 460, and a poly-Si region 440 which was formed after the first irradiation remains intact and is re-crystallized. In this case, at the boundary 421, a fine poly-Si region is formed, and then the growth of grains is progressed using the formed poly-Si as a seed, but at the boundary 420, the growth of grains is progressed using a region excluding the grains melted after the second irradiation among the grains formed after the first irradiation. as a seed. As a result, a structure as shown in FIG. 4c is obtained. In other words, a boundary 470 which is formed by progressing the grain growth from both sides of the slit after the second irradiation is moved by a distance 491 which was shifted from the original location for the second irradiation.

By this procedure, the grain size becomes larger due to an increase in grain length in the scanning direction. Furthermore, upon the second irradiation, since the seed crystal and a new crystal undergo continuous growth in a state where crystal orientation is not changed, a boundary 480 disappears.

FIG. 5a shows a condition after the laser beam was moved in any length while the above procedure was repeated. The lower portion of FIG. 5a shows a procedure where grains, which have been continued to grow in one direction, are present as an elongated form, and growing interfaces 520, 521 of grains, which have been grown from slit boundaries 510, 511 (위치수정, FIG. 5A 그림참조) after exposure to a slit at a front stage of growth, are grown into a liquid silicon 530.

Then, the scanning procedure is progressed to a point 551, and an a-Si region 550 is crystallized, thereby giving a structure as shown in FIG. 5b. The scanned distance is approximately equal to the reference numeral 580, and the length of the grown grains corresponds to the scanned distance 580. Since the slit is patterned according to the mask, movement of the laser beam by a given scanned distance results in formation of poly-Si patterns as shown in FIGS. 2b and 2c. The respective poly-Si patterns have a grain structure as shown in FIG. 5b. As shown in FIG. 5b, at the initial region where scanning was initiated, there is a region having many fine grains, i.e., a region shown by the reference numeral 560, since many grains competitively grow. Above the region 560, there is a region having elongated grains, i.e., a region shown by the reference numeral 570. The results of actual experiments indicate that the region 560 is smaller than 1 μm that is negligibly small in a patterned region of poly-Si ("Sequential lateral solidification of thin silicon films on $SiO_2$", R.S. Sposil and James S. Im, Appl. Phys. Lett., 69(19), 2864(1996)).

The SLS method is advantageous in that various shapes are obtained according to the shape of a mask, and for some masks, a single crystal Si island region can be selectively formed at a portion where a channel region of TFT is formed (U.S. Pat. No. 6,322,625).

Thus, the use of this method allows a poly-Si structure, the uniformity of device characteristics, and improvement in device performance to be obtained.

However, in a Si thin film obtained by SLS, if a regularity in the formation of a single crystal Si array having rectangular or hexagonal arrangement, and a single crystal Si island, does not coincide with the design of pixel and peripheral circuit arrangements, the uniformity of device characteristics is adversely affected.

Thus, in the existing SLS method, there can be a limitation in view of a design since a mask design for crystallization must match with pixel and peripheral circuit designs.

Furthermore, a method of making a single crystal among the SLS methods is to form a single crystal Si island in the strict sense and thus grain boundaries are present in several places of a substrate. Thus, if the pixel or the peripheral circuit is configured around the grain boundaries, excellent device characteristics and uniformity can be expected.

As a result, an ultimate solution to ensure excellent device characteristics and uniformity in any design scheme will be a method wherein single crystal silicon is formed over the entire substrate, or single crystal Si is grown only on a peripheral circuit portion and the remaining pixel region is kept at the state of a-Si so that single crystal Si having an excellent switching property for the peripheral circuit is formed outside the pixel region having low leakage current, thereby fundamentally preventing formation of the grain boundaries capable of causing non-uniformity.

For this purpose, according to the present invention, a method in which single crystal Si is easily formed at the desired location to the desired size using a simpler mask is proposed.

SUMMARY OF THE INVENTION

Accordingly, an object of the present invention is to provide a method for fabricating a single crystal silicon film, by which the crystallinity of low temperature poly-silicon silicon as an active layer of a thin film transistor, a pixel or peripheral circuit-driving device applied in LCD or OLED, can be increased, thereby forming single crystal silicon.

To achieve the above-mentioned object, the present invention provides a method for fabricating a single crystal silicon film, which comprises forming a single crystal region through a laser irradiation after forming a semiconductor layer or a metal thin film on a transparent or semi-transparent substrate, which comprises the steps of: forming a single crystal seed region on the substrate of the desired size by a crystallization method using laser irradiation; and converting the desired region of the semiconductor layer or metal thin film into a single crystal region, using the single crystal seed region.

Furthermore, the method of the present invention comprises the step of: irradiating the substrate of the desired size with a laser in a specific shape through a mask so that the laser-irradiated portion is firstly crystallized; conducting a first scanning process which comprises moving the laser by the desired distance so that a grain in the firstly crystallized portion is grown by the desired distance; completing the first scanning process after it was progressed by the desired distance, thereby forming a poly-crystal island region; conducting a second scanning process which comprises 90° turning the laser at the end of the first scanning process and scanning the seed grain formed in an elongated shape in the scanning direction during the first scanning process, so that the seed grain is grown to form a single crystal region; and irradiating the laser onto a portion of a single crystal seed region formed after progressing the second scanning process by the desired distance, thereby extending the single crystal region.

BRIEF DESCRIPTION OF THE DRAWINGS

The above and other objects, features and advantages of the present invention will be more apparent from the following detailed description taken in conjunction with the accompanying drawings, in which:

FIG. 2b shows a crystalline Si pattern formed using the mask of FIG. 2a;

FIG. 5b shows a patterned island of poly-Si formed by the process shown in FIG. 5a;

DETAILED DESCRIPTION OF THE PREFERRED EMBODIMENTS

Hereinafter, a method for fabricating a single crystal silicon film according to the present invention will be described in detail with reference to the accompanying drawings.

In order to enhance crystallinity and also to ensure uniformity in forming a polycrystalline silicon (poly-Si) thin film on an amorphous substrate such as a glass or plastic insulator, a single crystal or a single-crystal tile whose location was precisely controlled is formed over the entire substrate according to the present invention. This allows problems of the prior art to be fundamentally solved. A typical method for this purpose is designed in the present invention, and the crystallization of a-Si will be described herein by way of example.

In a principle to realize the present invention, a poly-Si island pattern, which undergone the prior SLS process, is subjected to an additional laser scanning process in a perpendicular direction to a direction in which grains of the island pattern were grown. This results in formation of a single crystal Si seed region. Then, according to a SLS process using this seed region, a single crystal Si region or a single crystal Si tile is formed over the entire substrate or formed on a certain region of the substrate, such as a region where a panel is formed, or a peripheral circuit region, in order to shorten process time.

Figure 1:
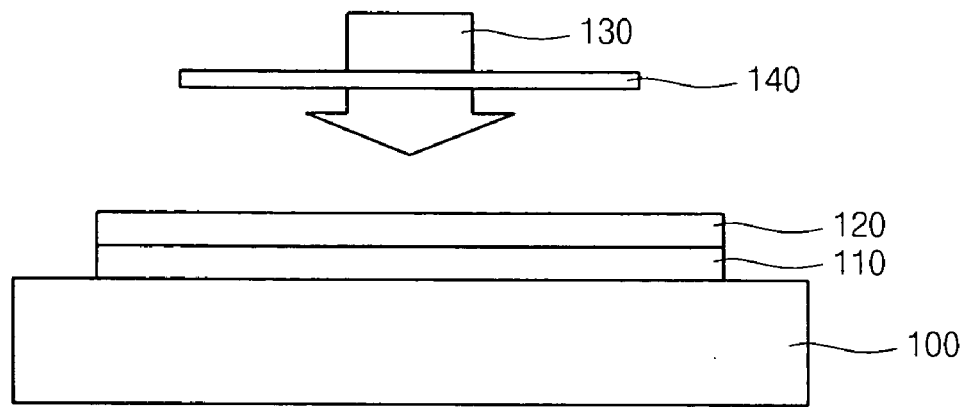
FIG. 1 is a schematic view showing the arrangement of a heat source (laser), a mask and a sample.
Figure 2A:
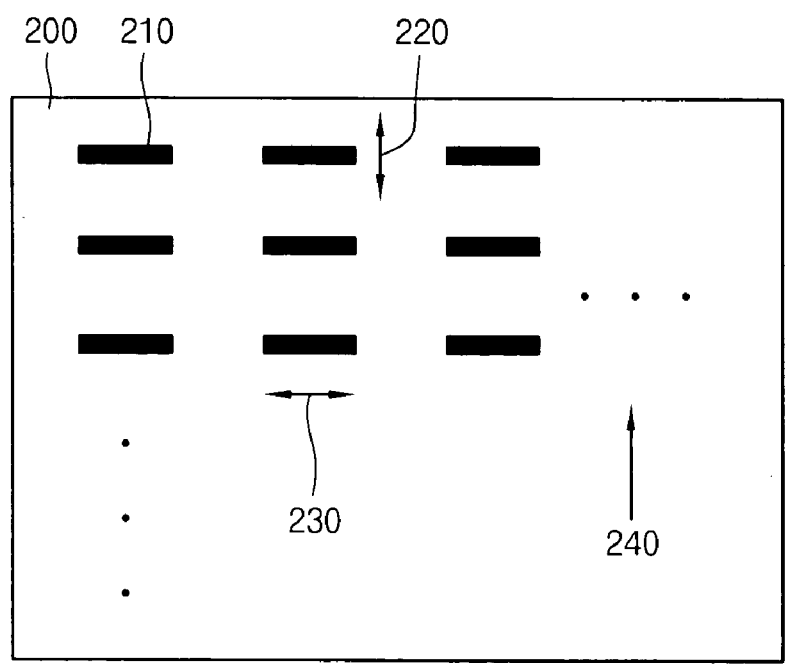
FIG. 2a shows a mask with a slit pattern.
Figure 2B:
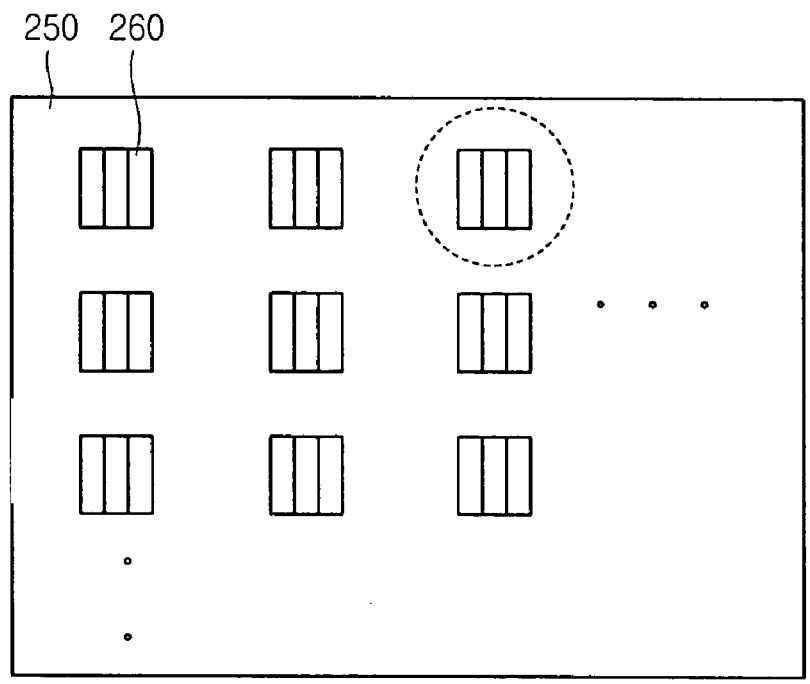
Figure 2C:
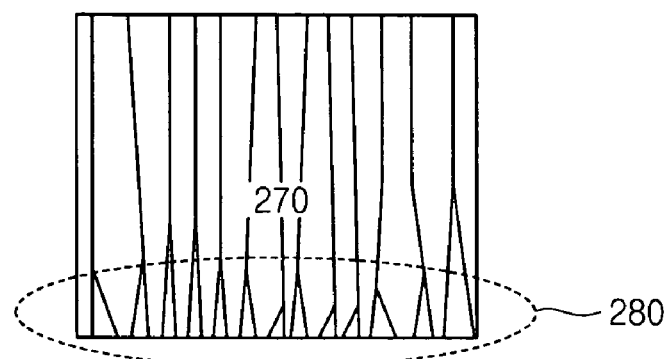
FIG. 2c is an enlarged schematic view showing a crystallized region of FIG. 2b.
Figure 3A:
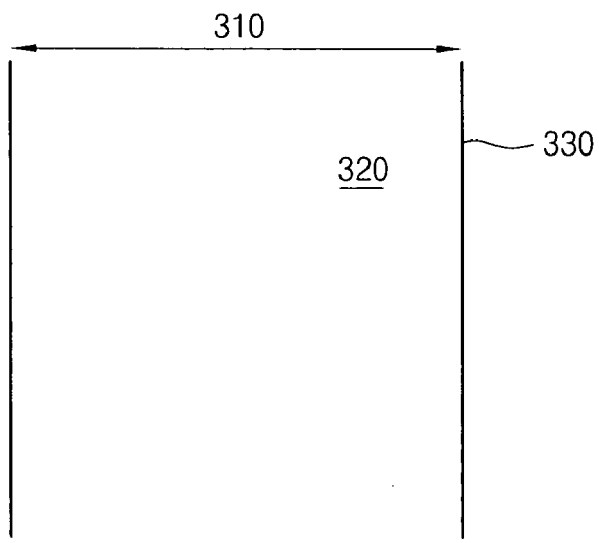
FIG. 3a to 3d are schematic views showing that a laser-irradiated region is crystallized according to the laser irradiation through a slit.
Figure 3B:
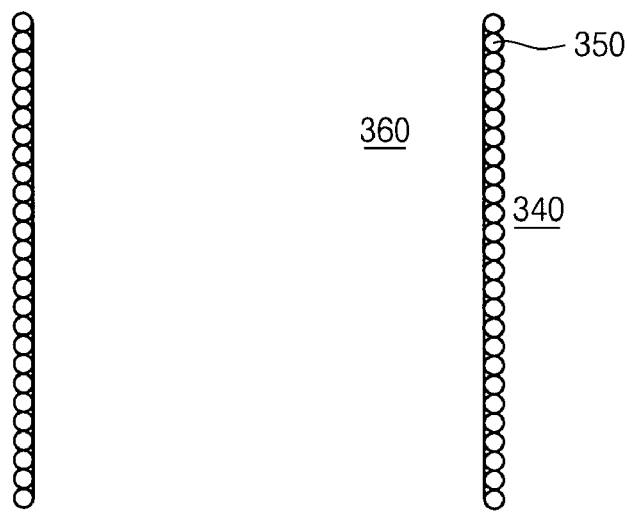
Figure 3C:
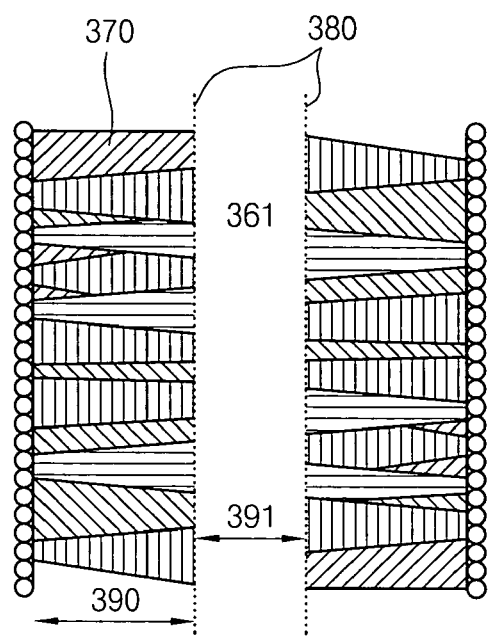
Figure 3D:
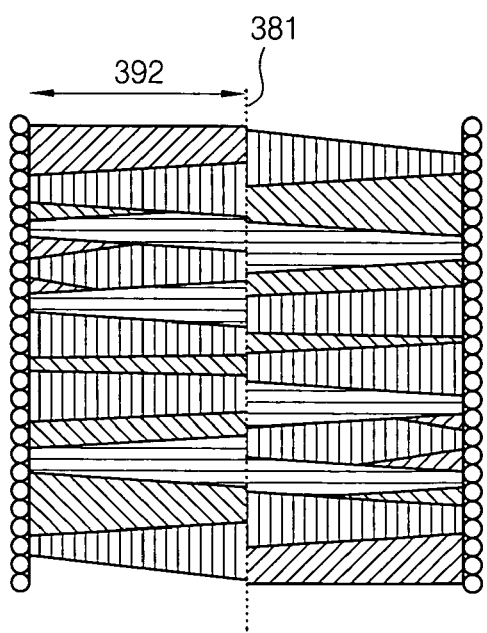
Figure 4A:
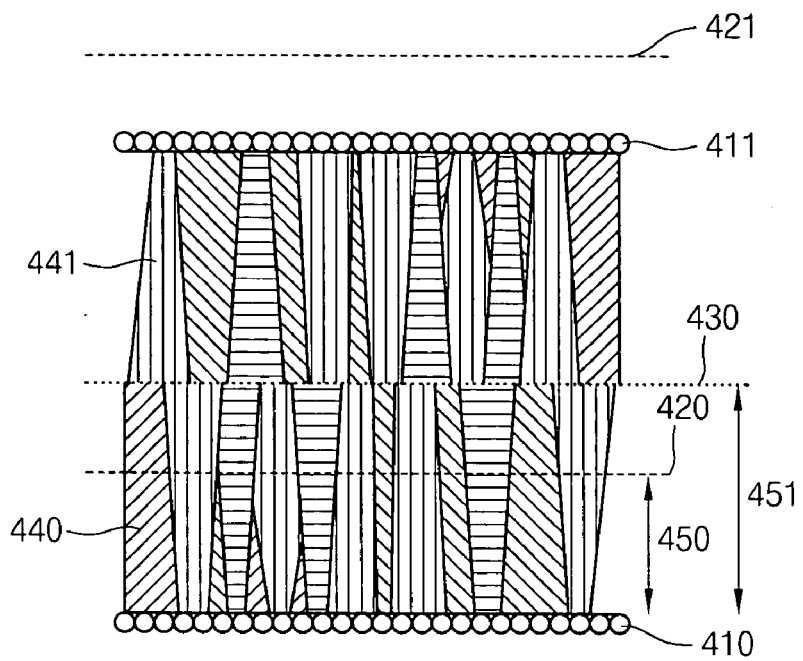
FIGS. 4a to 4c are schematic views showing a process of additional grain growth where grains grow in the lateral direction after they were crystallized by the laser irradiation through a slit.
Figure 4B:
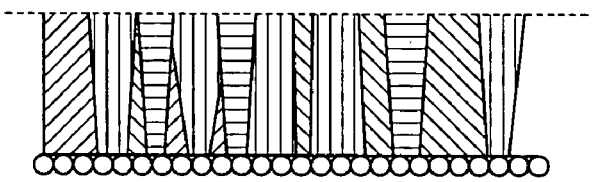
Figure 4C:
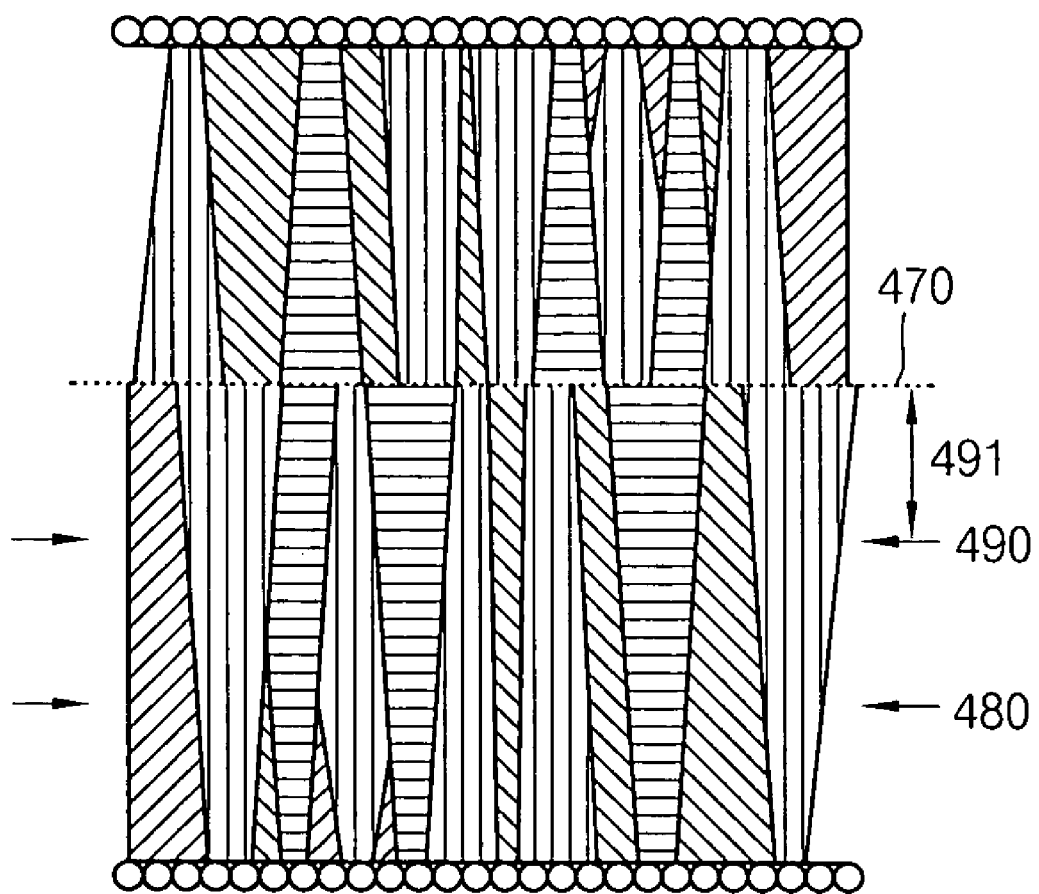
Figure 5A:
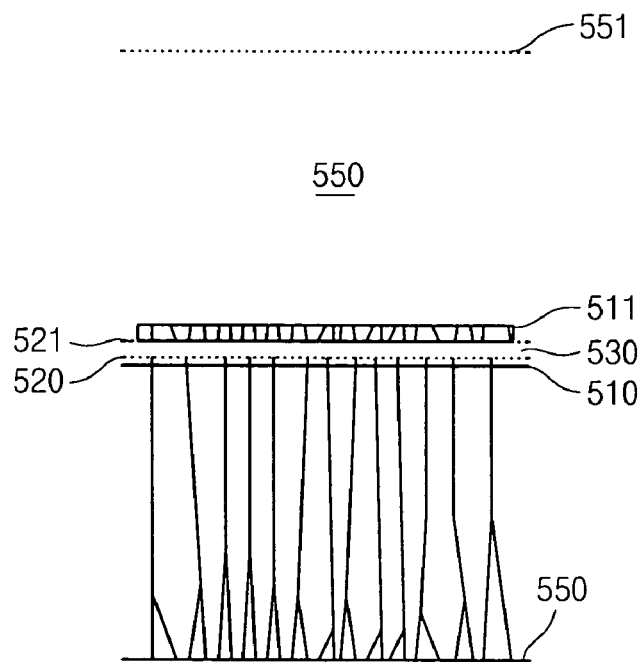
FIG. 5a is a view showing a process where grains grow in one direction by repetition of the melting and solidification caused by laser beam movement.
Figure 5B:
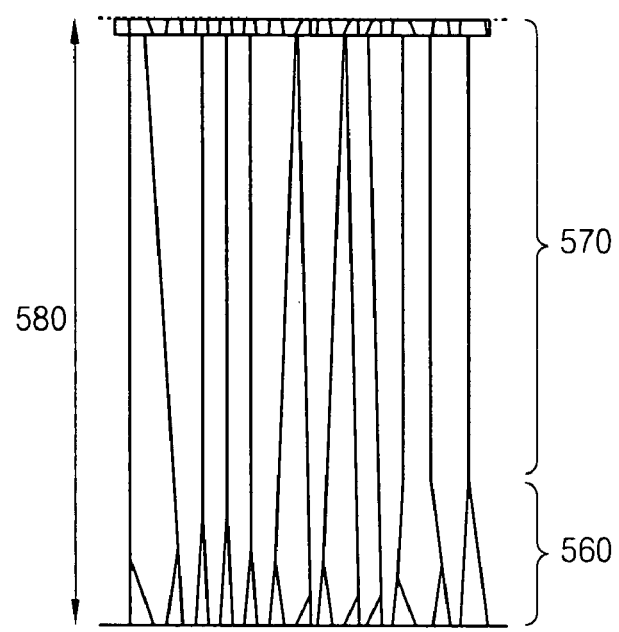
Figure 6:
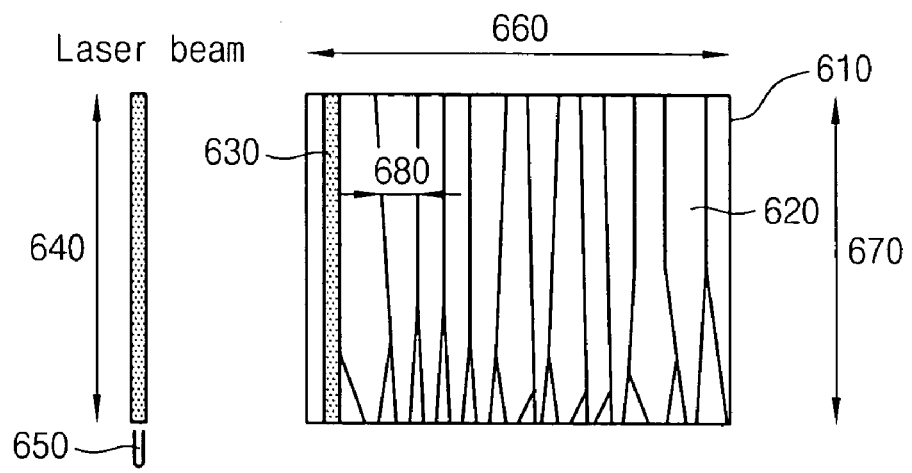
FIG. 6 is a schematic view showing a state where one edge of the poly-Si island formed in FIG. 5b was irradiated with a laser beam in order to conduct the second laser scanning of the poly-Si island in the perpendicular direction to a direction in which the poly-Si island was grown in one direction.

FIG. 6 shows the arrangement of a poly-Si island 610 having a width 660 and a length 670 completed in FIG. 5b and a laser beam 630 having a length 640 and a width 650 for use in the second scanning. The laser beam 630 is moved in the x-direction perpendicular to the first scanning direction, starting from one edge of the poly-Si island pattern 610.

It is preferred that the laser beam length 640 for the second scanning is approximately equal to the length 670 of the poly-Si island pattern 610. After the first scanning but before the second scanning, a mask is turned by 90° or the sample is turned by 90°.

Figure 7A:
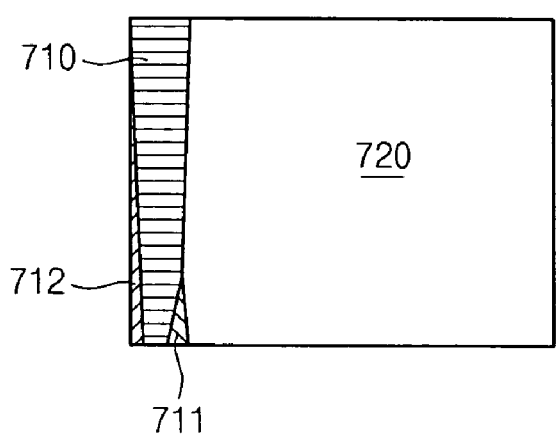
FIGS. 7a to 7c schematically show a process for forming a patterned Si island consisting of about one grain, in which a portion of poly-Si elongated by a laser beam is irradiated with a laser beam to melt the poly-Si, and the laser beam is moved in the scanning direction.
Figure 7B:
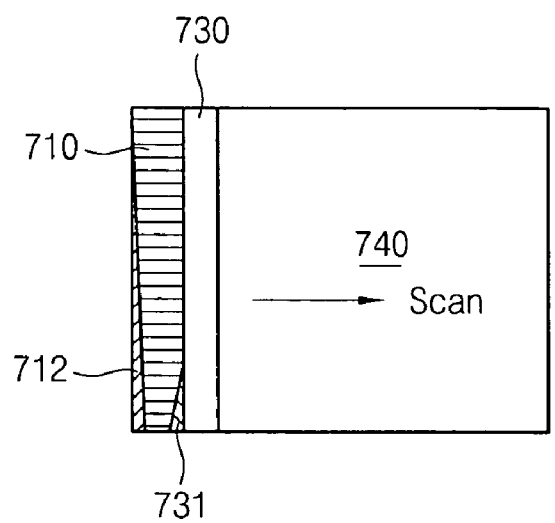
Figure 7C:
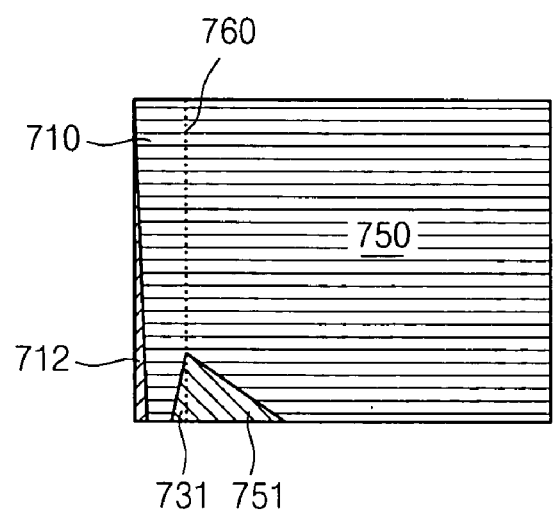

FIGS. 7a, 7b and 7c concretely show the second scanning process. For SLS, the laser beam width 650 is generally a few µm, and the width of an elongated grain in the poly-Si island pattern 610 is in the range of 1 to several µm. FIG. 7a schematically shows a state where grains are present in one edge of the poly-Si island pattern. A grain 710 is formed in an elongated shape in the first scanning process, and a grain 711 is not grown in the initial growth process.

As described above, the grain 711 has a very small size of about 1 µm. Since the accuracy of aligning of a laser beam in a SLS system is about sub-µmw, the laser beam can be aligned such that it melts only a portion of the grain 710 as shown in FIG. 7b. Of course, parts or all of the grain 730 can be melted. And more important, the size (length and width) of the grain, which was grown in an elongated form over the entire poly-Si island pattern, is similar to the dimension level of the laser beam.

Thus, the region 730 is liquefied after the first irradiation in the second scanning process, and the liquefied region is re-solidified. At this time, the grain 710 and the grain 731, which have very small sizes, serve as seeds, and the grain 710 forms most of the seeds. Thus, when the second scanning is progressed toward a poly-Si region 740, the poly-Si region 740 in FIG. 7b is converted into a single crystal Si region as shown in FIG. 7c via melting and solidification processes. When the grain 731 is partially melted upon the first irradiation in the second scanning, it can be grown in the scanning process, but its size is very small and its growth rate is slower than the grain 710 as found in the scanning process, and thus, the size of a newly grown region 751 is negligible. The boundary 760 between a portion melted upon the first irradiation of the second scanning and the remaining portion will disappear. This is because the seed region 710 and the crystallized region 750 have the same orientation.

There can be caused the worst where the aligning of the laser beam is inaccurate or pluralities of elongated grains are present in the seed region. If small grains formed at a lower portion in the first scanning process (e.g., grain 731) are ignored, seed crystals will be two crystals having similar growth rates.

Figure 8A:
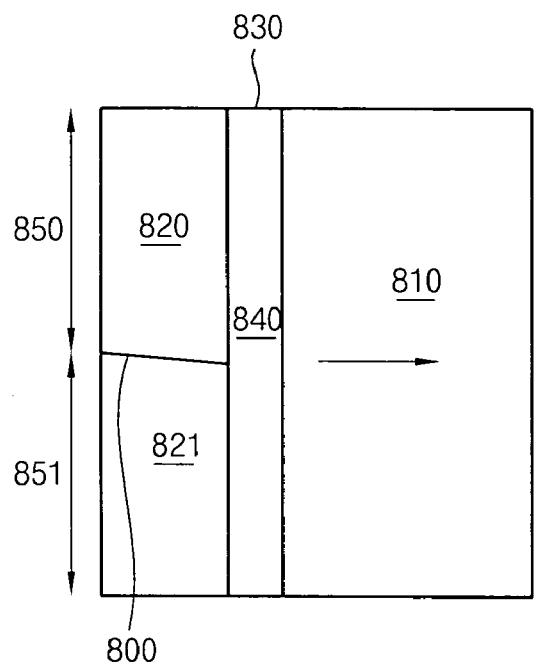
FIGS. 8a and 8b show a case where a single crystal is difficult to be obtained in a second scanning process, namely a case where seed grains are two and the two seed. grains show similar growth rates upon scanning in the x-direction, and thus, two regions having different crystal orientations are formed in a Si-island pattern.
Figure 8B:
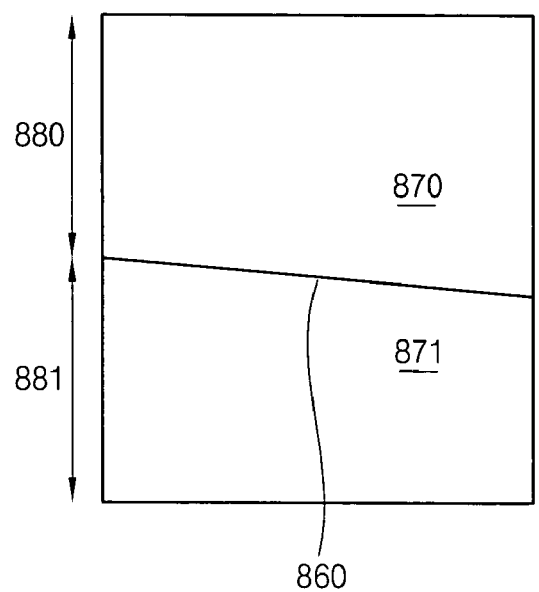

FIGS. 8a and 8b show the second scanning process under this condition. As two initial seed crystals 820, 821 are scanned with a laser beam 830 while removing a poly-Si region 810, a grain boundary 800 remaining before scanning extends while the poly-Si island pattern consists of two grains.

In this case, the growth of a grain 870 is superior to the growth of a grain 871 so that a region of the grain 870 is larger than the grain 871. Even in this case, such grains sufficiently act as a single crystal seed layer for converting the remaining substrate region or certain region into a single crystal region. This is because the size of the respective grain regions 850, 851, 880, 881 is about several tens μm sufficiently larger than the width of a laser beam passed through a slit, and thus, a grain suitably chosen from such grains may be applied as a seed crystal for the subsequent crystallization.

FIGS. 11a to 11d show a method of forming a single crystal Si region over the entire substrate in the above-mentioned manner.

Figure 11A:
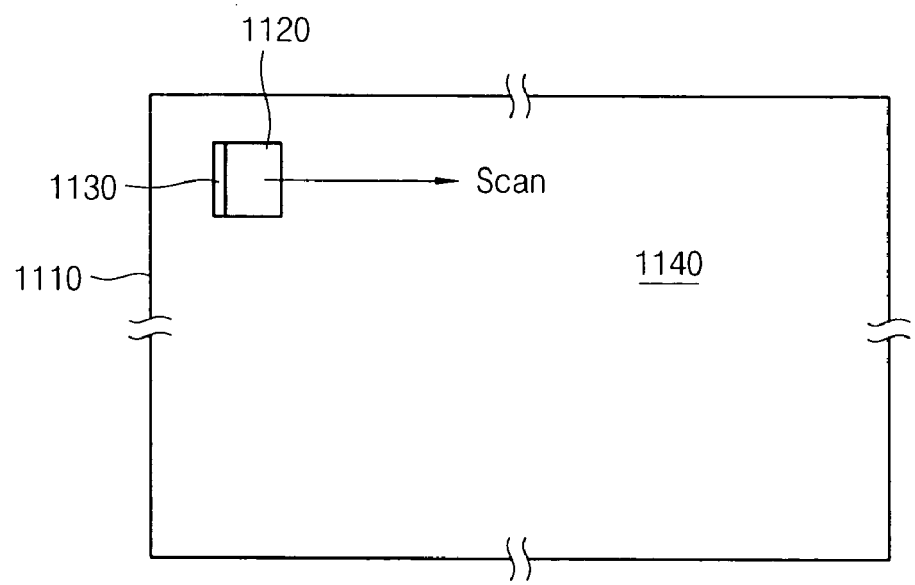
FIGS. 11a to 11d are sequential views showing a process of forming single crystal Si over the entire substrate by the processes of FIGS. 6, 9 and 10.

FIG. 11a shows that a laser beam 1130 is irradiated starting from one edge of a poly-Si island 1120 formed upon the first scanning, and the second scanning is progressed to one edge of a substrate 1110 in the scanning direction shown in the figure.

As a laser beam 1160 reaches the opposite edge of the substrate 1110 after the second scanning, a single crystal Si seed region 1150 of a rectangular shape is formed and the remaining region remains at a-Si.

Figure 11B:
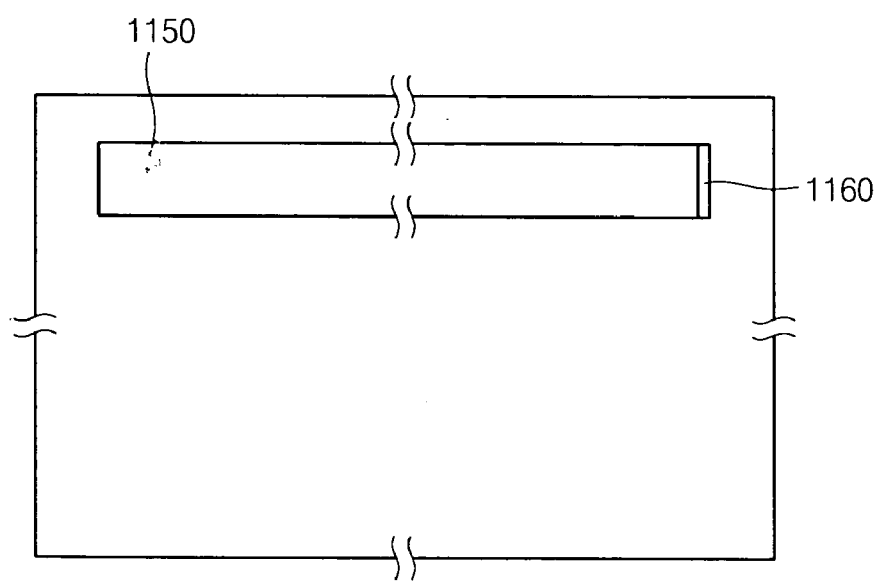
Figure 11C:
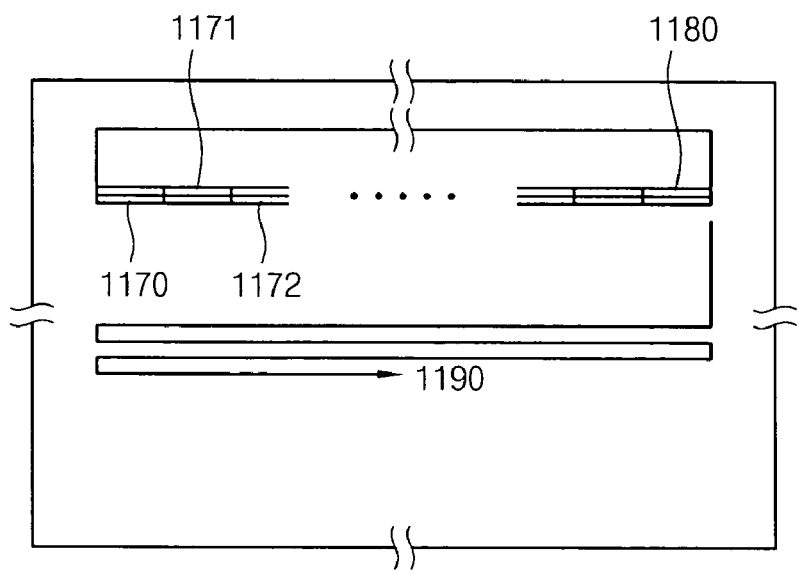
Figure 11D:
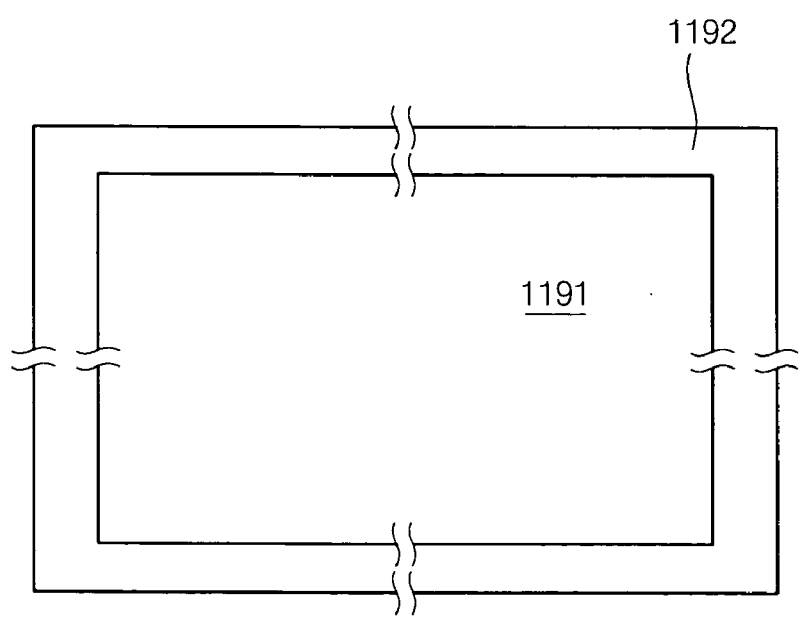

Following this, the laser beam is irradiated onto a portion of the single crystal Si seed region 1150 as shown in FIG. 11C, thereby repeating melting and solidification. The laser irradiation is conducted in the order of 1170, 1171, . . . 1180, in a direction shown by the reference numeral 1190. In this way, a single crystal Si region is formed over the entire substrate as shown in FIG. 11d.

The respective irradiation steps 1170, 1171 in FIG. 11c may be conducted on several places at the same time such that process time can be shortened. For example, the irradiation steps 1170 and 1172 are conducted at the same time, and then, the irradiation steps 1171 and 1173 are conducted at the same time.

This method has the following differences from a "2 shot SLS process" (U.S. Pat. No. 6,368,945), which was recently proposed by James Im et al. In the present invention, a single crystal Si region is formed by the first scanning in the x-direction and the second scanning in the y-direction. Particularly in the case of the second scanning, since seed crystals are of small number (about one or two), the second scanning from crystals of small number allows single crystal seed regions to be formed. Once such seed regions are formed, crystallization is conducted in the same manner as the "2 shot SLS process" proposed by James Im et al. As a result, in the "2 shot SLS process", a structure where poly-Si regions are arranged as shown in FIG. 3 is obtained, but in the present invention, a single crystal Si region is formed. Namely, in the present invention, a process of forming the single crystal Si region at an initial stage is added so that the microstructure of a final thin film is greatly changed. In the present invention, additional processes (first and second scanning processes) are required to form the single crystal regions, but the present invention is advantageous in that the resulting structure provides very high uniformity and degree of freedom of design as compared to the "2 shot SLS process" The additional processes can be partially improved as in other embodiments of the present invention which will be described later.

Figure 9A:
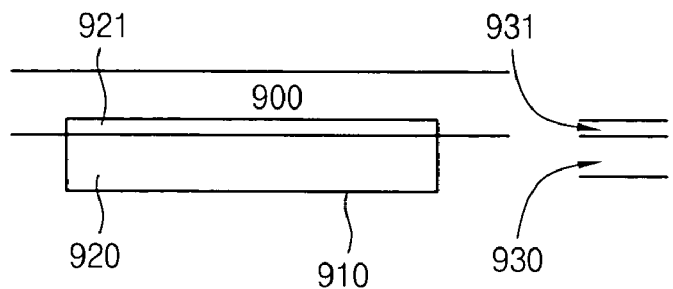
FIGS. 9a to 9g schematically show a process of extending a single crystal Si region by conducting an additional SLS process using a single crystal Si seed region.
Figure 9B:
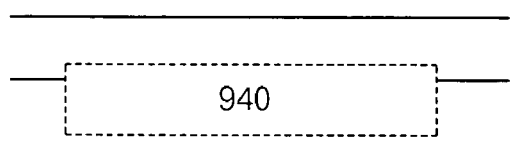
Figure 9C:
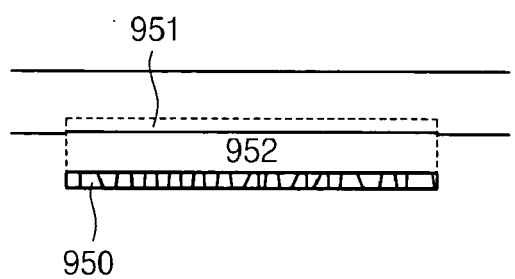
Figure 9D:
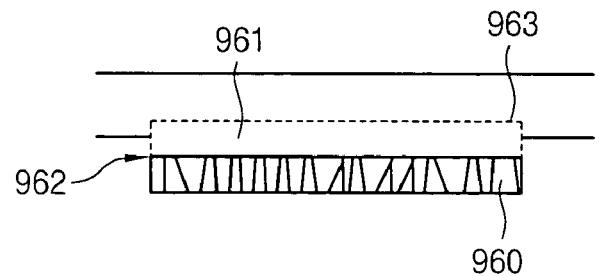
Figure 9E:
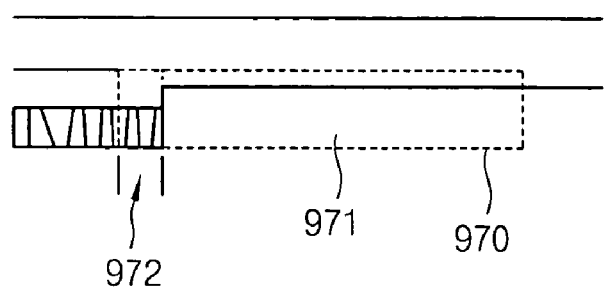
Figure 9F:
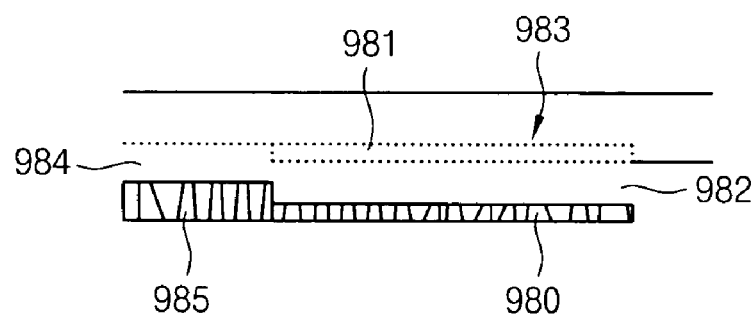
Figure 9G:
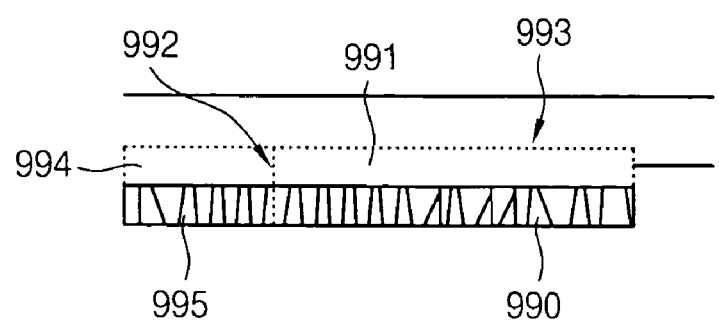
Figure 10:
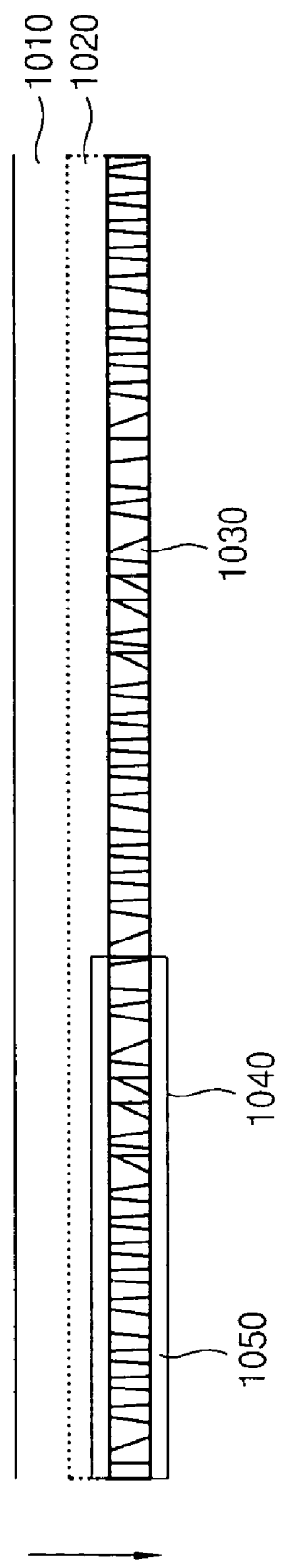
FIG. 10 schematically shows a process of carrying out an additional SLS process using the single crystal Si region formed in FIGS. 9a to 9g as a seed, thereby extending the single crystal Si region in the reverse y-direction (shown by an arrow)

FIGS. 9a to 9g and FIG. 10 show the process shown in FIG. 11c in more detail. FIG. 9a shows a state where a laser beam 910 is shifted by the reference numeral 931 in the reverse y-direction and irradiated onto a single crystal Si region 900 formed upon the second scanning (FIG. 11b). In this case, the irradiated region includes the original single crystal region 921 and the a-Si region 920, and as shown in FIG. 9b, a region 940 corresponding to the sum of the two regions is melted. Immediately after laser irradiation, as shown in FIG. 9c, there are a region 951 grown from the original single crystal region and a region 950 grown from the a-Si region.

At the end of crystallization, as shown in FIG. 9d, a single crystal region 961 and a poly-Si region 960 are met with each other at a boundary 962. Thus, the size of the single crystal region is increased by a distance 931 moved in the reverse y-direction, thereby extending the single crystal region. In this case, the laser irradiation is conducted in such a manner that there is no grain formed by nucleation in the melted Si region 952 of FIG. 9c before the reference numerals 961 and 960 are formed. Since the newly formed single crystal region 961 was grown from the region 900, an original single crystal region, a boundary 963 is not substantially observed.

Thereafter, the laser beam is moved in the x-direction and irradiated. In this case, as shown in FIG. 9e, a region 970, which is irradiated with a laser beam 970, overlaps with a portion of the previously formed region as shown by the reference numeral 972, thereby removing a boundary effect. The irradiated region 971 is melted, and as shown in FIG. 9f, there are a region 981 growing from the single crystal region, and a region 980 growing from the a-Si region. At the end of growth, as shown in FIG. 9g, a single crystal region 991 and a poly-Si region 990 are met with each other. It is believed that the boundary 992 between the previously formed single crystal region 994 and the newly formed single crystal region 991, and the boundary 993 between the original single crystal region 900 and these single crystal regions, are not substantially observed.

This is because such boundaries 992, 993 are not boundaries formed by meeting of grains having different orientations, and have the same crystal orientation. When scanning in the x-direction is continued in this way, the size of the single crystal region becomes larger, and at the end of the scanning in the x-direction, scanning in the reverse y-direction is progressed with laser irradiation. This state is shown in FIG. 10. After scanning in the x-direction was completed, a laser irradiation region is shifted in the reverse y-direction and laser irradiation is conducted in such a manner that a single crystal region 1020 acts as a seed, and at the same time, a poly-Si region 1030 is melted.

In this way, a region 1050 irradiated with a laser 1040 is melted and crystallized again. When this scanning is conducted as shown in FIG. 11*c*, a single crystal Si region is finally formed over the entire substrate as shown in FIG. 11*d*.

The above-mentioned crystallization method results in formation of the single crystal Si region over the entire substrate. In this method, process time is somewhat increased as compared to the existing SLS process, due to the additional processes required to form the initial single crystal seed region. To solve this shortcoming, the following embodiments of the present invention are described.

Figure 12A:
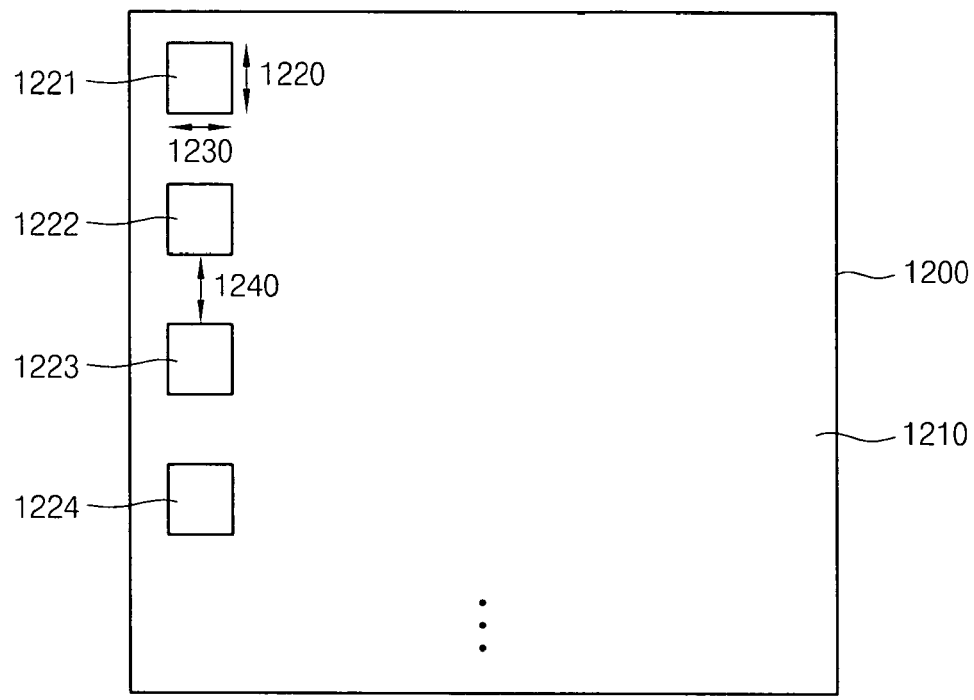
FIGS. 12a and 12b show another embodiment of the present invention, in which several single crystal seed regions are formed at several places of a substrate at the same time so as to reduce process time, and single crystal silicon tiles are formed over the entire substrate using the single crystal seed regions.
Figure 12B:
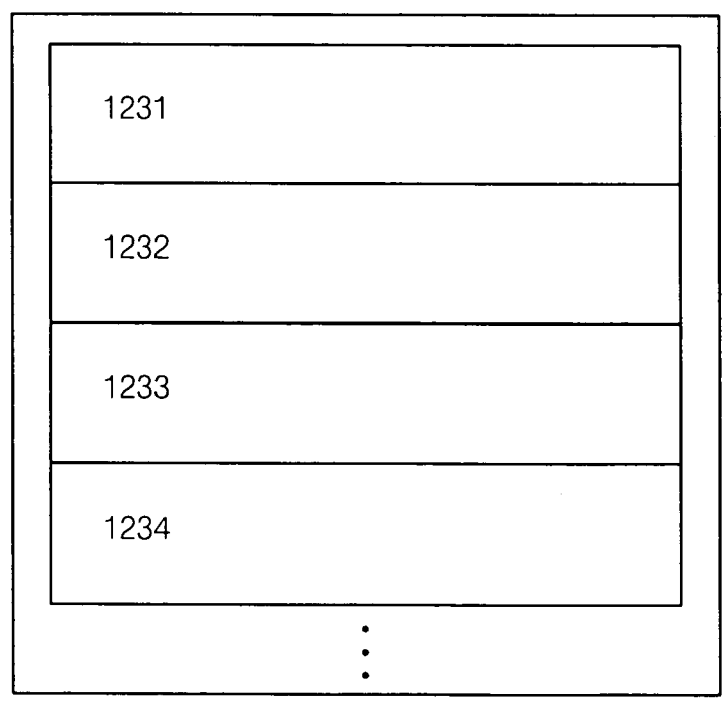

FIGS. 12*a* and 12*b* show a method of forming several single crystal Si seed regions by the first and second scanning processes at the same time. An a-Si film 1210 is deposited on a substrate 1200, and irradiated with a laser through a mask where slit patterns were formed. Since several slit patterns are formed in the mask, poly-Si islands 1221, 1222, 1223, 1224 having a width 1230 and a length 1220 are formed upon the first laser scanning at the same time, and irradiated with a laser upon the second scanning in the x-direction at the same time. This laser irradiation is conducted in the reverse y-direction, using the single crystal Si regions formed by the second scanning as a seed, to produce single crystal Si tiles 1231, 1232, 1233, 1234 as shown in FIG. 12*b*. Although this method is disadvantageous in that the boundaries between the Si tiles 1231, 1232, 1233, 1234 occur due to a difference in orientation between such Si tiles, it allows process time to be reduced by about ¼ as compared to the above-mentioned method where the single crystal Si film is formed over the entire substrate. This embodiment is advantageously applied for products having a panel region smaller than single crystal Si tile regions.

FIGS. 13*a* to 13*e* show another embodiment of the present invention. An a-Si film is first deposited on a substrate 1300, and then irradiated with a laser beam through a mask 1304 having slit patterns therein. In the mask 1304, slits having a length 1306 and a width 1305 are regularly arranged at an interval 1360 from each other. A distance moved by the first scanning is shown by the reference numeral 1301.

At the end of the first scanning, poly-Si islands 1311 are formed in the respective regions at regular intervals, and the reference numeral 1312 remains at the state of a-Si. Then, after a laser beam is aligned such that it is placed near a boundary 1310 perpendicularly to the first scanning direction upon the second scanning, the second scanning is conducted in the x-direction. In this case, the scanning distance is adjusted such that it is as long as the reference numeral 1302.

Figure 13A:
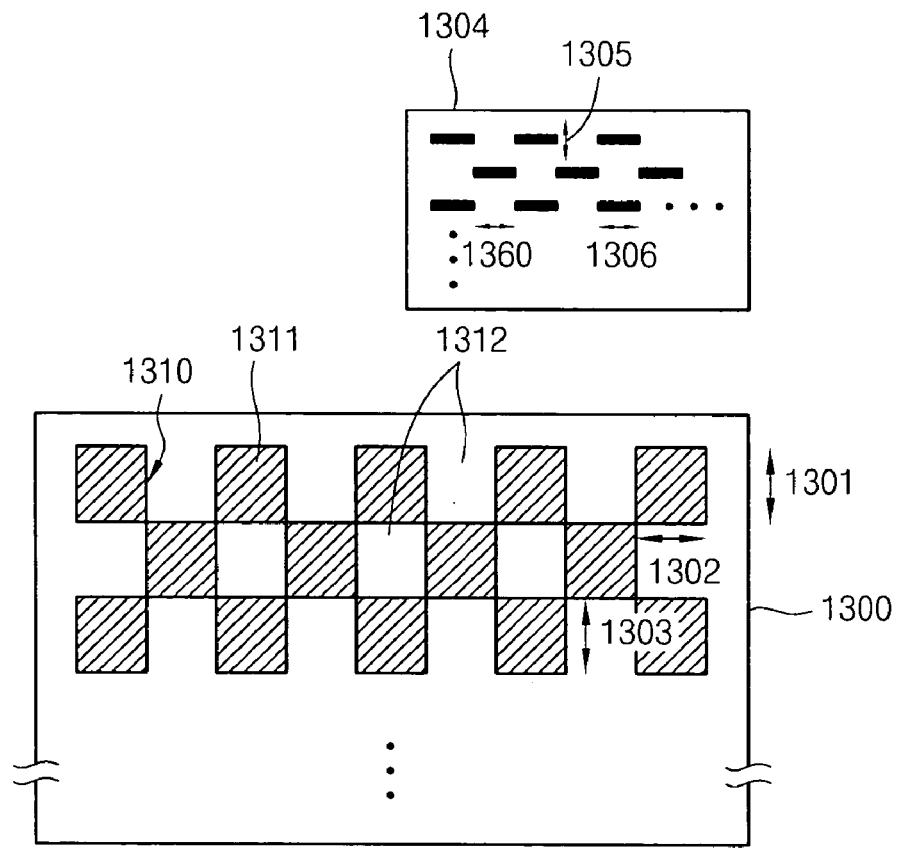
FIGS. 13a to 13e show still another embodiment of the present invention, in which single crystal Si tiles of various patterns are formed over the entire substrate from monocrystalline seed regions in order to reduce process time.
Figure 13B:
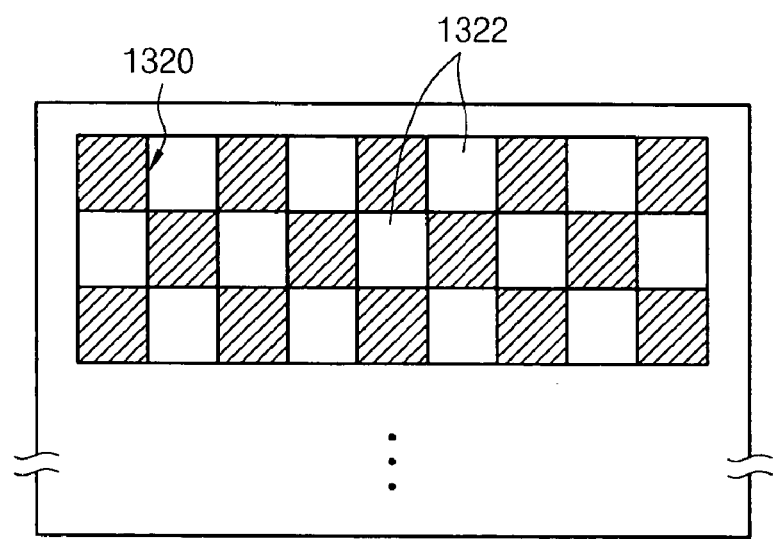

Thus, the growth of single crystal Si is progressed toward a-Si regions 1312, using a certain grain within the respective poly-Si islands as a seed, so that tiles consisting of poly-Si islands and single crystal Si regions 1322 are formed over the entire substrate as shown in FIG. 13*b*.

Figure 13C:
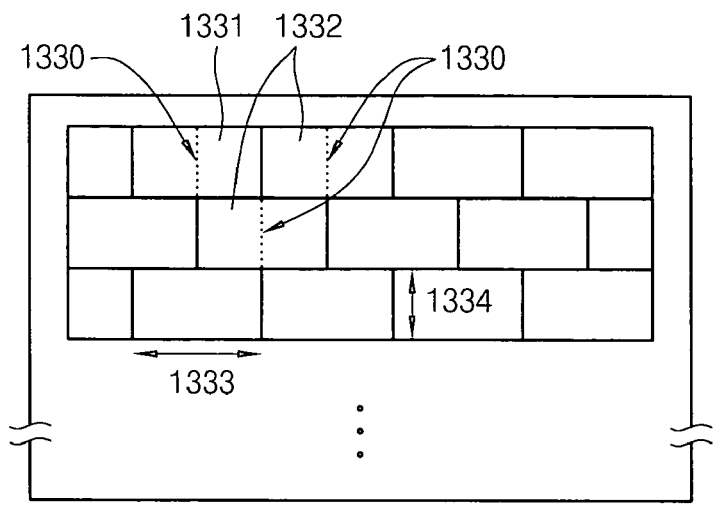
Figure 13D:
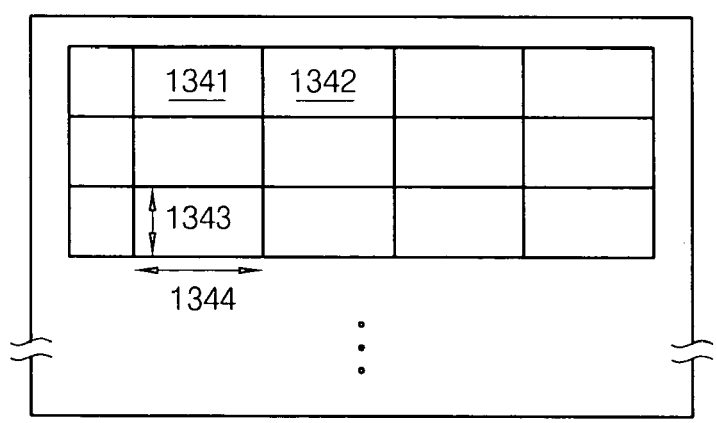
Figure 13E:
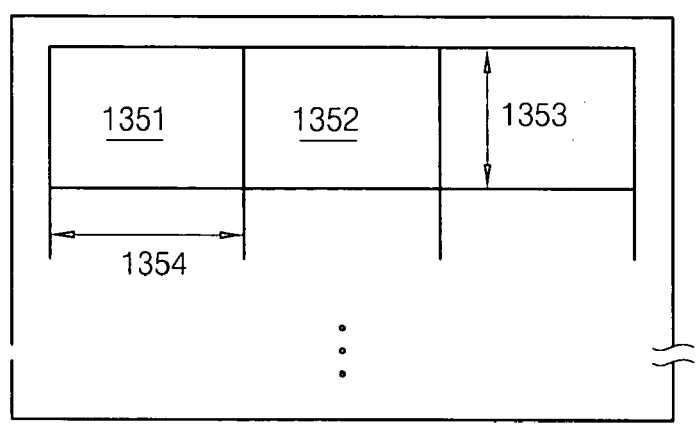

Thereafter, when additional scanning is conducted using the single crystal regions 1322 as a seed, the regions which were made of the poly-Si islands are converted into single crystal Si regions 1331 as shown in FIG. 13*c* so that single crystal Si regions having a width 1333 and a length 1334 are formed in a tile shape over the entire substrate. In this case, the reference numeral 1330, which was a boundary between the poly-Si island and the single crystal Si region in FIG. 13*b*, is not substantially observed. Depending on the scanning direction and the additional steps, various single-crystal Si tile shapes as shown in FIGS. 13*d* and 13*e* can be obtained.

This embodiment is advantageous in that process time is remarkably shortened, since the length of the second scanning over the entire substrate as shown in FIG. 11*b* is greatly reduced. This embodiment can be applied for a case where the entire substrate does not need to be made single-crystal according to the panel size, or a case where the reduction of cost is required for products where securing of the uniformity of a Si thin film is important without requiring a Si thin film of quality as high as single crystal Si.

In this embodiment, the size 1302, 1303 of the tiles need to be sufficiently small such that it does not affect uniformity.

Figure 14:
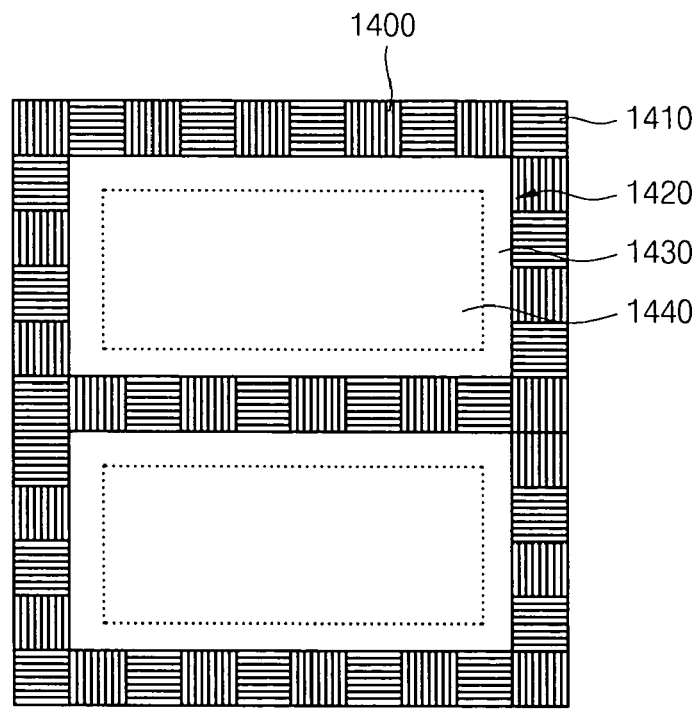
FIG. 14 shows yet another embodiment of the present invention, in which a single crystal is formed on only panel area to eliminate the process time and cost required to convert undesired portions into single crystal regions.

In another embodiment, the scanning direction and number are suitably controlled as shown in FIG. 14, so that only a portion 1440 (pixel region) for forming a panel 1420, and a peripheral circuit region 1430, on a substrate 1400, are made of a single crystal, and the remaining portion is in the form of poly-Si tiles 1410. This allows process time to be reduced while ensuring uniformity.

This embodiment can be applied for products where a peripheral circuit has high switching speed, and the size of a panel is large.

Figure 15:
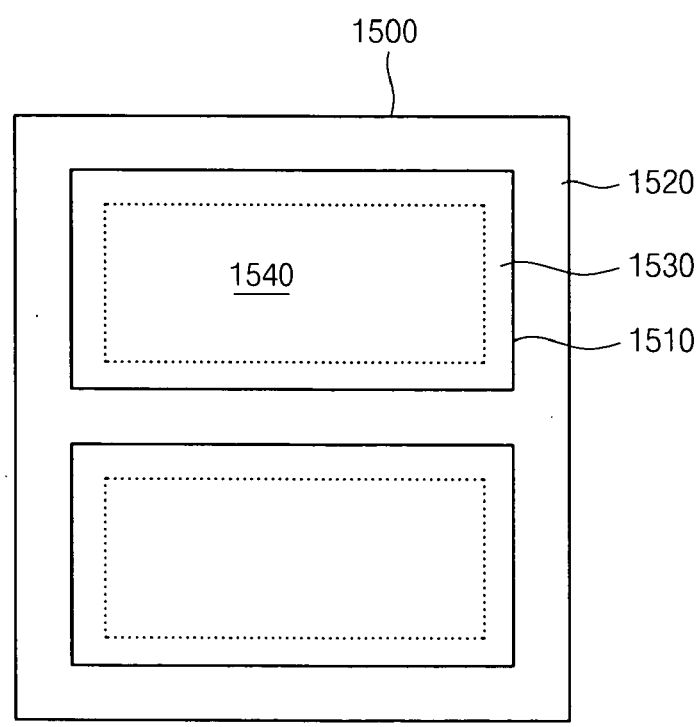
FIG. 15 shows further another embodiment of the present invention, in which a single crystal is formed only on a peripheral circuit-forming area of a panel portion, and portions other than a pixel region and a panel pixel area remain at a-Si without crystallization.

In another embodiment, as shown in FIG. 15, an a-Si film 1520 is deposited on a substrate 1500, only a peripheral circuit region 1530 of a panel 1510 is made of a single crystal, and a pixel region 1540 remains at a-Si.

This embodiment can be applied in a case where a-Si TFT having low leakage current is disposed at a pixel region, and peripheral TFT requiring high-speed switching is made of a single crystal. This embodiment allows process time to be remarkably reduced while ensuring a characteristic of low leakage current.

All the above-mentioned methods can be realized by suitable coping of laser irradiation direction and mask alignment, and regarded as solutions to cope with costs, product characteristics and various designs.

As described above, according to the present invention, the single crystal Si seed region is formed by the additional laser irradiation process using one or two seed grains, which were formed in an elongated shape within a poly-Si, island formed by the prior SLS process. Starting from this seed region, the single crystal Si region can be formed over the entire substrate or a portion or certain region of the substrate.

Thus, the present invention allows the uniformity problem to be fundamentally solved, so that it is possible to cope with various product designs. Furthermore, in fabricating a panel on the single crystal Si region, it can cope with switching speed in a peripheral circuit.

In the embodiments of the methods disclosed herein, the insulating film is a silicon nitride or oxide film selected from $SiO_x$, $SiO_xH_y$, $SiN_x$ and can be either bi-layer or multiple-layer or a film of nitride or oxide of a metal selected from Al, Cu, Ti and W. In the embodiments of the methods described herein, the semiconductor layer can be made of a material selected from either a-Si (amorphous silicon), a-Ge (amorphous germanium), a-$Si_x$$Ge_y$ (amorphous silicon germanium), poly-Si (poly-crystalline silicon), poly-Ge (poly-crystalline germanium) or poly-$Si_xGe_y$ (poly-crystalline silicon-germanium). The metal film can be made of a metal selected from Al, Cu, Ti, W, Au or silver or compound of any of these metals and a semiconductor.

Accordingly, peripheral circuit parts are integrated to reduce the cost of module parts. Moreover, since single crystal silicon is applied unlike the existing process, sufficient switching speed allowing a drive circuit and also various interface parts to be integrated can be exhibited so that a system-on-panel can be ultimately formed. Thus, the present invention is applied for a wider range of products than existing LTPS TFT-LCD products.

Furthermore, according to the present invention, since a pixel region may also be formed of a-Si, products can be produced, which have a characteristic of low leakage current and where a peripheral circuit is integrated. Also, process costs can be greatly reduced.

Moreover, when a pixel region is made of single crystal silicon, it can exhibit high current so that it is suitable in OLED, a current drive type display, and low voltage driving becomes possible.

In addition, since the present invention can realize formation of single crystal Si on a large-sized glass substrate and also a small-sized substrate such as a Si wafer, it may also be applied in SOI (system-on-insulator) in a semiconductor memory integrated circuit process or in a three-dimensional integrated circuit process.

Finally, when laser crystallization is applied on wiring material, such as aluminum (Al) or copper (Cu), other than Si, to form a single crystal on the wiring material, bad wiring caused by electro-migration in an ultrahigh density integrated circuit can also be reduced.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating single crystal silicon film comprising: forming a single crystal region through a laser irradiation after forming a semiconductor layer or a metal thin film on a transparent or semi-transparent substrate, which comprises the steps of:

forming a single crystal seed region on the substrate of a desired size by a crystallization method using laser irradiation, the step of forming a single crystal seed region being comprised of the steps of:

irradiating the substrate of the desired size with a laser in a specific shape through a mask so that the laser-irradiated portion is firstly crystallized;

conducting a first scanning process which comprises moving the laser by a desired distance so that a grain in the firstly crystallized portion is grown by the desired distance;

completing a first scanning process after it was progressed by the desired distance, thereby forming a poly-crystal island region;

conducting a second scanning process which comprises 90 degree turning of the laser at the end of the first scanning process and scanning the seed grain formed in an elongated shape in the scanning direction during the first scanning process, so that the seed grain is grown to form a single crystal region; and irradiating the laser onto a portion of a single crystal seed region formed after progressing the second scanning process by the desired distance, thereby extending the single crystal region.

2. The method of claim 1, further comprising the steps of: conducting the laser irradiation onto several places of the substrate at the same time, such that single crystal seed regions are formed on several places by the first and second scanning processes; and conducting additional scanning, starting from the single crystal regions as seeds, so as to extend the single crystal regions while consuming poly-crystal regions or amorphous regions remaining on the substrate, thereby forming single crystal tiles over the entire substrate.

3. The method of claim 2, wherein the size and location of the single crystal tiles are controlled by various combinations of the scanning direction and alignment of the laser irradiation regions and various shapes and sizes of laser slits.

4. The method of claim 1, wherein the single crystal region is formed over the entire substrate, or a portion where a semiconductor device is formed, or a portion where a circuit region of the semiconductor device is formed.

5. The method of claim 1, wherein the transparent substrate includes glass, plastic and insulating film.

6. The method of claim 5, wherein the insulating film is a silicon oxide, silicon hydroxide or a silicon nitride, and their bilayer or multiple layer, or a film of nitride or oxide of a metal selected from Al, Cu, Ti and W.

7. The method of claim 1, wherein the semiconductor layer is made of one selected from amorphous silicon, amorphous germanium, amorphous silicon germanium, poly-crystalline silicon, poly-crystalline germanium, poly-crystalline silicon germanium.

8. The method of claim 1, wherein the metal thin film is made of a metal selected from Al, Cu, Ti, W, Au and Ag, or a compound of the metal and a semiconductor.

9. The method of claim 1, wherein the laser is an excimer laser.

10. The method of claim 1, wherein 90 degree turning of the laser of the second scanning process is realized by turning one of the mask and the substrate.

* * * * *